(12) United States Patent
Hurni et al.

(10) Patent No.: US 11,139,417 B1
(45) Date of Patent: Oct. 5, 2021

(54) DISPLAY WITH REPLACEMENT ELECTRODES WITHIN PIXEL ARRAY FOR ENHANCED CURRENT SPREAD

(71) Applicant: Facebook Technologies, LLC, Menlo Park, CA (US)

(72) Inventors: Christophe Antoine Hurni, Seattle, WA (US); John Michael Goward, Redmond, WA (US); Chloe Astrid Marie Fabien, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 2 days.

(21) Appl. No.: 16/696,820

(22) Filed: Nov. 26, 2019

(51) Int. Cl.
*H01L 25/00* (2006.01)
*H01L 33/00* (2010.01)
*H01L 33/38* (2010.01)
*H01L 33/62* (2010.01)
*G02B 27/01* (2006.01)
*H01L 25/075* (2006.01)

(52) U.S. Cl.
CPC ........ *H01L 33/382* (2013.01); *G02B 27/0176* (2013.01); *H01L 25/0753* (2013.01); *H01L 33/62* (2013.01); *G02B 2027/0178* (2013.01); *H01L 2933/0016* (2013.01)

(58) Field of Classification Search
CPC ..... H01L 25/0753; H01L 25/18; H01L 25/50; H01L 25/105; H01L 33/382; H01L 33/62; H01L 33/32; H01L 33/20; H01L 33/06; H01L 33/44; H01L 33/486; H01L 2933/0016; H01L 2933/0033; H01L 2933/0025; G02B 27/0176; G02B 27/0172; G02B 27/0093; G02B 27/4272; G02B 2027/0178; G02B 2027/014; G02B 2027/0134; G02B 2027/138; G02B 2027/0147

See application file for complete search history.

(56) References Cited

U.S. PATENT DOCUMENTS

| | | | |
|---|---|---|---|
| 8,507,941 B2 * | 8/2013 | Khan | H01L 27/153 257/99 |
| 2011/0073838 A1 * | 3/2011 | Khan | H01L 27/153 257/13 |

* cited by examiner

*Primary Examiner* — Nikolay K Yushin
(74) *Attorney, Agent, or Firm* — Fenwick & West LLP

(57) ABSTRACT

In a flip-chip LED assembly having an array of LEDs formed on the same substrate, different LEDs of the array have different distances to the n-contacts of the assembly. This may cause current crowding as current has to spread from the n-contacts through the substrate to each the farthest LEDs of the LED array, requiring LEDs that are farther away to be driven with a higher voltage in order to receive a desired amount of current. To spread current more evenly through the LED assembly and reduce a voltage difference between the closest and farthest LEDs of the array, one or more additional n-contacts are formed within the LED array. In some embodiments, the n-contacts may replace a pixel of the LED array. In other embodiments, one or more p-contacts of the LED array are resized or repositioned to accommodate the additional n-contacts without sacrificing pixels of the LED array.

16 Claims, 15 Drawing Sheets

DISPLAY WITH REPLACEMENT ELECTRODES WITHIN PIXEL ARRAY FOR ENHANCED CURRENT SPREAD

BACKGROUND

This disclosure relates to structure and operation of a light emitting diode (LED) assembly, and in particular to a flip-clip LED assembly.

A display device is often used in a virtual reality (VR) or augmented-reality (AR) system as a head-mounted display or a near-eye display. In some display devices, light generated by an LED assembly is projected to locations of an image field within a display period to form an image. A flip-chip LED assembly may comprise an array of LEDs each having a corresponding p-contact, but sharing one or more n-contacts. The distance between the p-contact of an LED and an n-contact depends on the position of the LED in an array. Hence, the voltage required to drive the LED at a certain current density will be different depending the location of the LED in the array, which is undesirable.

SUMMARY

Embodiments described herein generally relate to an LED assembly (e.g., a flip-chip LED assembly) having an array of LEDs. Different LEDs of the array have different distances to the n-contacts of the assembly. This may cause current crowding as current spreads from the n-contacts through the substrate to each the farthest LEDs of the LED array, causing LEDs that are farther away to be driven with a higher voltage in order to receive a desired amount of current. To reduce current crowding, spreading current more evenly through the LED assembly, and reduce a voltage difference between the closest and farthest LEDs of the array, one or more additional n-contacts may be formed within the LED array.

In some embodiments, the n-contacts may replace a pixel of the LED array. In other embodiments, one or more p-contacts of the LED array are resized or repositioned to accommodate the additional n-contacts without sacrificing pixels of the LED array.

In some embodiments, an LED assembly comprises a substrate and a first contact of a first polarity formed on a first surface of the substrate. The LED assembly further comprises a pixel array disposed on the first surface of the substrate, each pixel of the array corresponding to an LED and having a corresponding contact of a second polarity to face away from the substrate, and wherein at least a subset of pixels in the pixel array are operated by supplying current between the first contact and the corresponding contact of the subset of pixels. The LED assembly further comprises one or more second contacts of the first polarity, each formed between two or more LEDs of the pixel array, wherein the one or more second contacts increase a level of current spread between contacts of the first and second polarities of the LED assembly during operation of the LED assembly. In some embodiments, the contacts of the first polarity may correspond to n-contacts, while contacts of the second polarity may correspond to p-contacts. In some embodiments, the pixel array comprises a uniform array of spaces on the first surface of the substrate, each space occupied by a respective LED or a contact of the one or more second contacts of the first polarity. In other embodiments, a spacing between a contact of the one or more second contacts of the first polarity and the two or more LEDs of the pixel array that the contact is formed between is different from a spacing between two or more LEDs of another portion of the pixel array.

Figure 1:
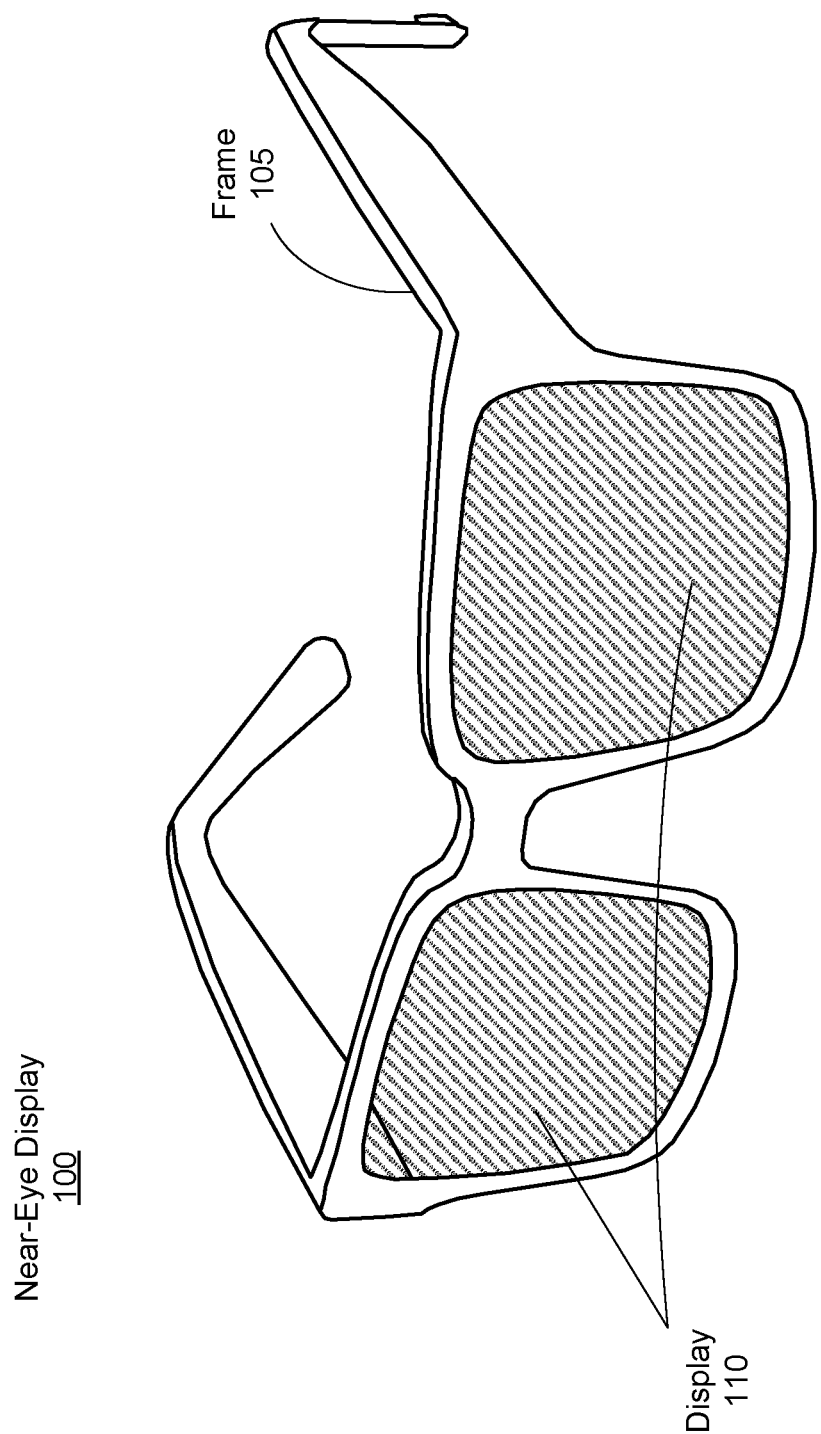
FIG. 1 is a perspective view of a near-eye-display (NED), in accordance with an embodiment.

The figures depict embodiments of the present disclosure for purposes of illustration only.

DETAILED DESCRIPTION

Embodiments relate to an LED assembly comprising an array of LEDs, each corresponding to a respective first contact (e.g., p-contact), formed on the same substrate (e.g., n-type substrate) and sharing one more second contacts (e.g., n-contact). The LED assembly may be a flip-chip LED assembly where both n-contacts and p-contacts are formed on the same side.

Different LEDs of the LED array will have different distances to the n-contacts of the LED assembly. For example, the n-contacts of the LED assembly may be located near a periphery or edge of the LED array, such that a distance between LEDs near the center of the array to the n-contacts will be greater than the distance of LEDs near the edge of the array to the n-contacts. This may cause current crowding due to spreading of current from the n-contacts through the substrate to each the farthest LEDs of the LED array. As such LEDs that are farther from the n-contacts may need to be driven with a higher voltage in order to receive a desired amount of current.

In order to reduce current crowding and a voltage difference between different LEDs of the LED array, the LED array may be formed to include one or more additional n-contacts formed within the LED array. In some embodiments, the n-contacts are formed in trenches at fixed positions within the LED array, allowing the n-contacts to contact the n-substrate of the LED assembly. In some embodiments, the n-contacts replace one or more LEDs (p-contacts) of the LED array, while in other embodiments, the n-contacts are formed in spaces between the p-contacts of the LED array. By forming additional n-contacts within the LED array, distance between each LED and the nearest n-contact is reduced, reducing the voltage swing between different LEDs within the LED array, and preventing current crowding.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Near-Eye Display

Figure (FIG. 1 is a diagram of a near-eye display (NED) 100, in accordance with an embodiment. The NED 100 presents media to a user. Examples of media presented by the NED 100 include one or more images, video, audio, or some combination thereof. In some embodiments, audio is presented via an external device (e.g., speakers and/or headphones) that receives audio information from the NED 100, a console (not shown), or both, and presents audio data based on the audio information. The NED 100 may operate as a VR NED. However, in some embodiments, the NED 100 may be modified to also operate as an augmented reality (AR) NED, a mixed reality (MR) NED, or some combination thereof. For example, in some embodiments, the NED 100 may augment views of a physical, real-world environment with computer-generated elements (e.g., images, video, sound, etc.).

The NED 100 shown in FIG. 1 includes a frame 105 and a display 110. The frame 105 includes one or more optical elements which together display media to users. The display 110 is configured for users to see the content presented by the NED 100. As discussed below in conjunction with FIG. 2, the display 110 includes at least a source assembly to generate an image light to present media to an eye of the user. The source assembly includes, e.g., a light source, an optics system, or some combination thereof.

FIG. 1 is only an example of a VR system. However, in alternate embodiments, FIG. 1 may also be referred to as a Head-Mounted-Display (HMD).

Figure 2:
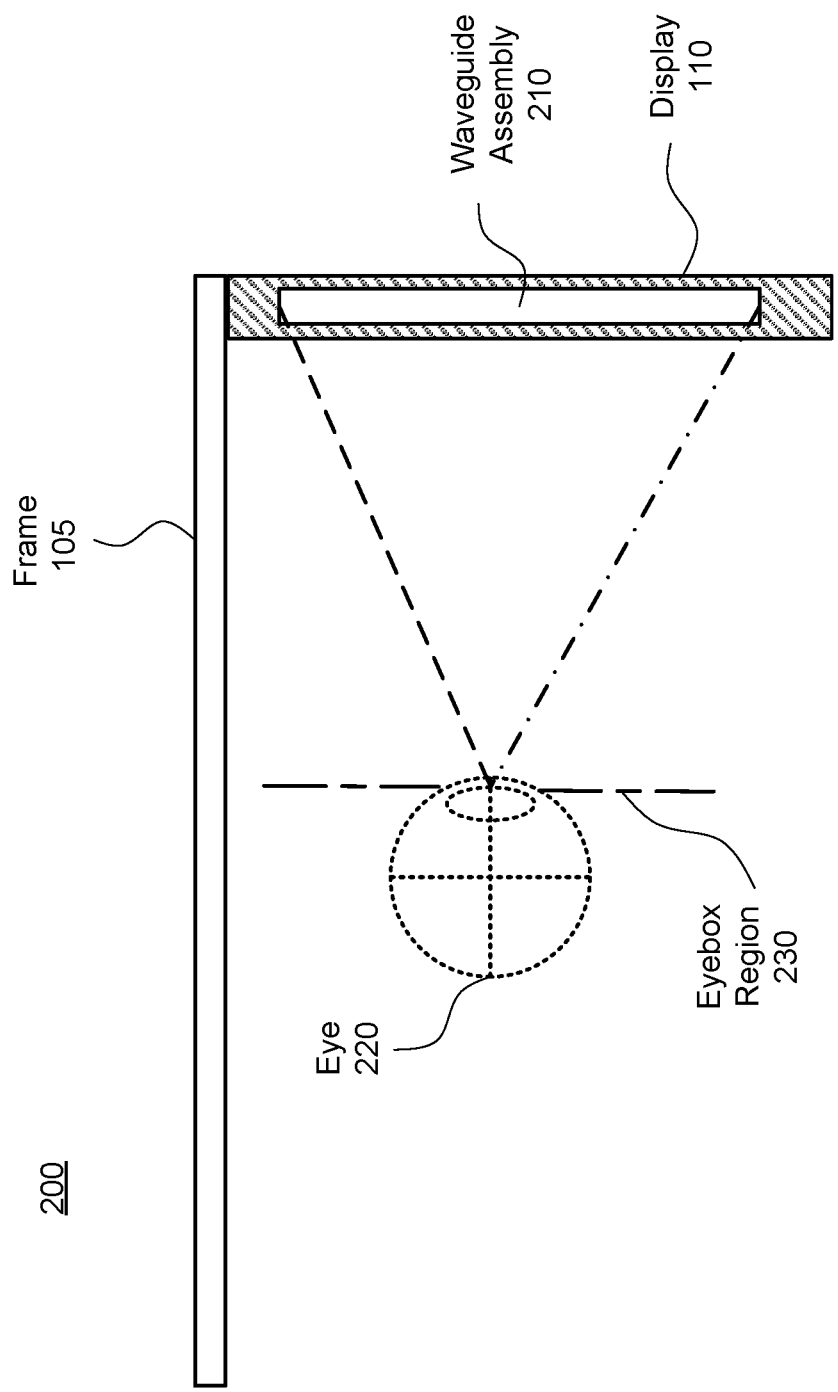
FIG. 2 is a cross-section of an eyewear of the NED illustrated in FIG. 1, in accordance with an embodiment.

FIG. 2 is a cross section 200 of the NED 100 illustrated in FIG. 1, in accordance with an embodiment. The cross section 200 illustrates at least one waveguide assembly 210. An exit pupil is a location where the eye 220 is positioned in an eyebox region 230 when the user wears the NED 100. In some embodiments, the frame 105 may represent a frame of eye-wear glasses. For purposes of illustration, FIG. 2 shows the cross section 200 associated with a single eye 220 and a single waveguide assembly 210, but in alternative embodiments not shown, another waveguide assembly which is separate from the waveguide assembly 210 shown in FIG. 2, provides image light to another eye 220 of the user.

The waveguide assembly 210, as illustrated below in FIG. 2, directs the image light to the eye 220 through the exit pupil. The waveguide assembly 210 may be composed of one or more materials (e.g., plastic, glass, etc.) with one or more refractive indices that effectively minimize the weight and widen a field of view (hereinafter abbreviated as 'FOV') of the NED 100. In alternate configurations, the NED 100 includes one or more optical elements between the waveguide assembly 210 and the eye 220. The optical elements may act (e.g., correct aberrations in image light emitted from the waveguide assembly 210) to magnify image light emitted from the waveguide assembly 210, some other optical adjustment of image light emitted from the waveguide assembly 210, or some combination thereof. The example for optical elements may include an aperture, a Fresnel lens, a convex lens, a concave lens, a filter, or any other suitable optical element that affects image light.

Figure 3:
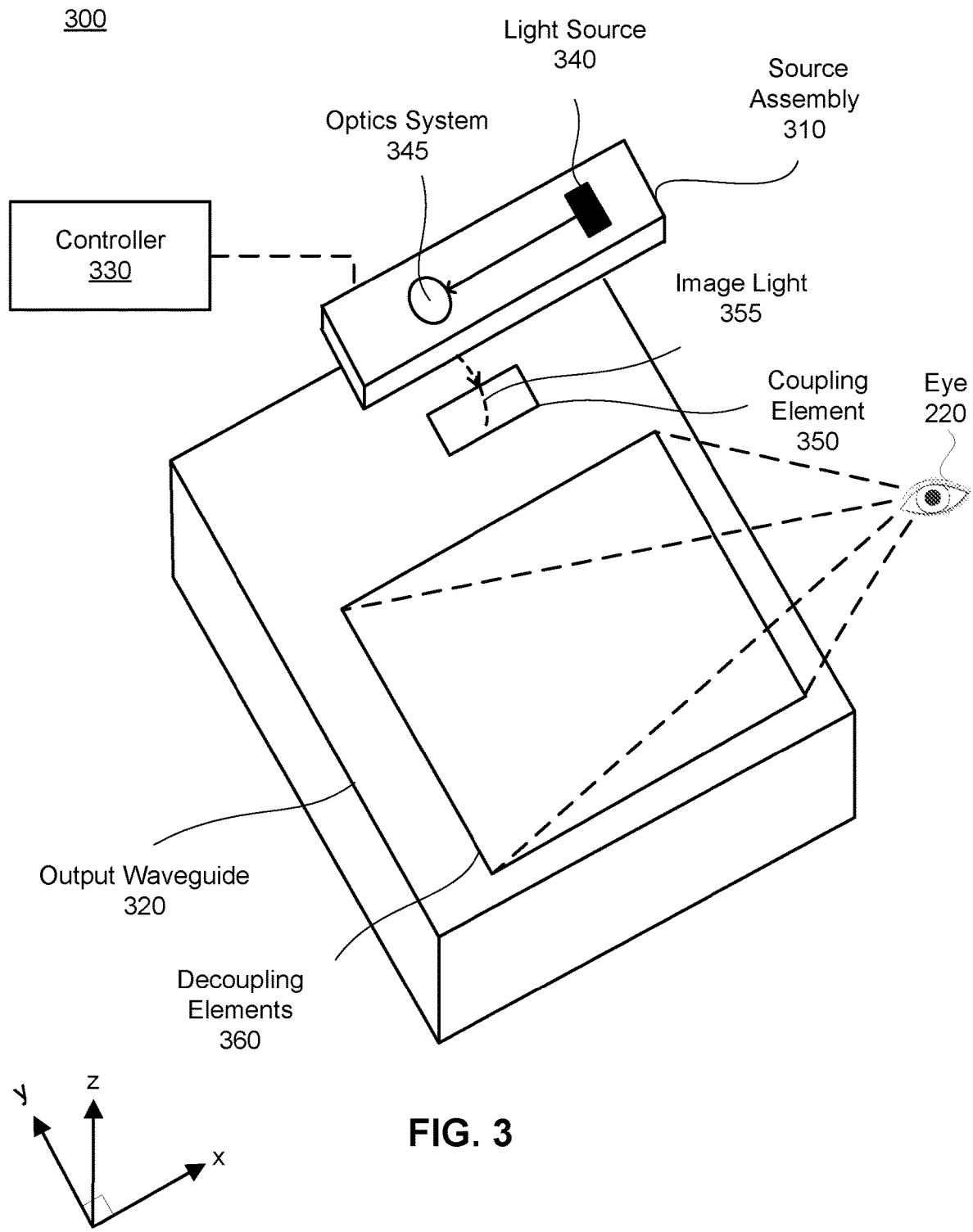
FIG. 3 is a perspective view of a display device, in accordance with an embodiment.

FIG. 3 illustrates a perspective view of a display device 300, in accordance with an embodiment. In some embodiments, the display device 300 is a component (e.g., the waveguide assembly 210 or part of the waveguide assembly 210) of the NED 100. In alternative embodiments, the display device 300 is part of some other NEDs, or another system that directs display image light to a particular location. Depending on embodiments and implementations, the display device 300 may also be referred to as a waveguide display and/or a scanning display. However, in other embodiment, the display device 300 does not include a waveguide or a scanning mirror. For example, the display device 300 can include a two-dimensional matrix of light emitters that direct project light on an image field such as a screen without a scanning mirror. In another embodiment, the image emitted by the two-dimensional matrix of light emitters may be magnified by an optical assembly (e.g., lens) before the light arrives a waveguide or a screen.

For a particular embodiment that uses a waveguide and an optical system, the display device 300 may include a source assembly 310, an output waveguide 320, and a controller 330. The display device 300 may provide images for both eyes or for a single eye. For purposes of illustration, FIG. 3 shows the display device 300 associated with a single eye 220. Another display device (not shown), separated (or partially separated) from the display device 300, provides image light to another eye of the user. In a partially separated system, one or more components may be shared between display devices for each eye.

The source assembly 310 generates image light 355. The source assembly 310 includes a light source 340 and an optics system 345. The light source 340 is an optical component that generates image light using a plurality of light emitters arranged in a matrix. The light source 340 generates an image light including, but not restricted to, a Red image light, a Blue image light, a Green image light, an infra-red image light, etc.

The optics system 345 performs a set of optical processes, including, but not restricted to, focusing, combining, conditioning, and/or scanning processes on the image light generated by the light source 340. In some embodiments, the optics system 345 includes a combining assembly, a light conditioning assembly, a waveguide assembly, and/or a scanning mirror assembly, as described below in detail in conjunction with FIG. 4. The source assembly 310 generates and outputs an image light 355 to a coupling element 350 of the output waveguide 320.

The output waveguide 320 is an optical waveguide that outputs image light to an eye 220 of a user. The output waveguide 320 receives the image light 355 at one or more coupling elements 350, and guides the received input image light to one or more decoupling elements 360. The coupling element 350 may be, e.g., a diffraction grating, a holographic grating, some other element that couples the image light 355 into the output waveguide 320, or some combination thereof. For example, in embodiments where the coupling element 350 is diffraction grating, the pitch of the diffraction grating is chosen such that total internal reflection occurs, and the image light 355 propagates internally toward the decoupling element 360. The pitch of the diffraction grating may be in the range of 300 nm to 600 nm.

The decoupling element 360 decouples the total internally reflected image light from the output waveguide 320. The decoupling element 360 may be, e.g., a diffraction grating, a holographic grating, some other element that decouples image light out of the output waveguide 320, or some combination thereof. For example, in embodiments where the decoupling element 360 is a diffraction grating, the pitch of the diffraction grating is chosen to cause incident image light to exit the output waveguide 320. An orientation and position of the image light exiting from the output waveguide 320 are controlled by changing an orientation and position of the image light 355 entering the coupling element 350. The pitch of the diffraction grating may be in the range of 300 nm to 600 nm.

The output waveguide 320 may be composed of one or more materials that facilitate total internal reflection of the image light 355. The output waveguide 320 may be composed of e.g., silicon, plastic, glass, or polymers, or some combination thereof. The output waveguide 320 has a relatively small form factor. For example, the output waveguide 320 may be approximately 50 mm wide along X-dimension, 30 mm long along Y-dimension and 0.5-1 mm thick along Z-dimension.

The controller 330 controls the imaging operations of the source assembly 310. The controller 330 determines imaging instructions for the source assembly 310 based at least on the one or more display instructions. Display instructions are instructions to render one or more images. In some embodiments, display instructions may simply be an image file (e.g., bitmap). The display instructions may be received from, e.g., a console of a VR system (not shown here). Imaging instructions are instructions used by the source assembly 310 to generate image light 355. The imaging instructions may include, e.g., a type of a source of image light (e.g., monochromatic, polychromatic), one or more illumination parameters, one or more scanning parameters (e.g., a scanning rate, an orientation of a scanning apparatus, etc.), or some combination thereof. The controller 330 includes a combination of hardware, software, and/or firmware not shown here so as not to obscure other aspects of the disclosure.

Figure 4:
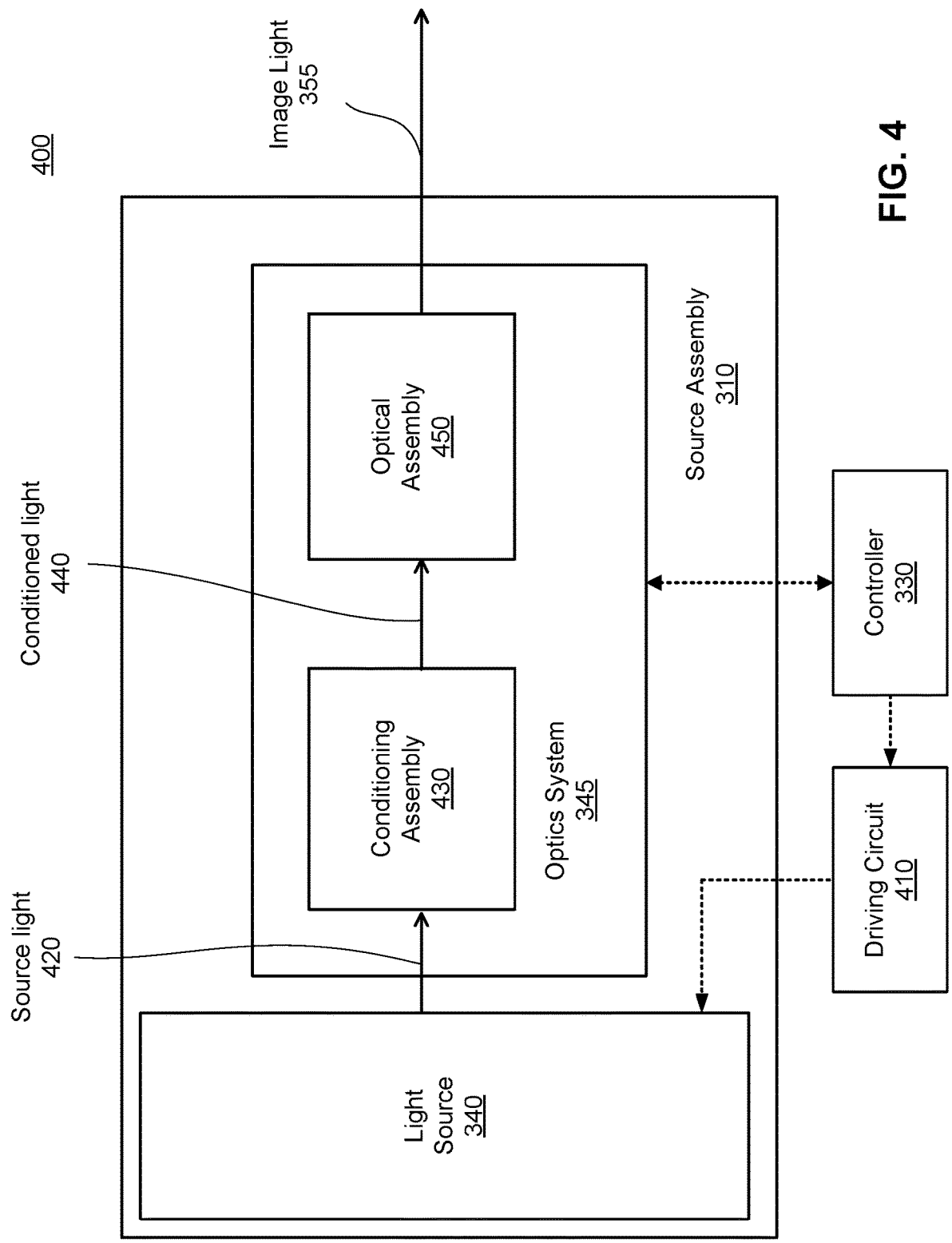
FIG. 4 illustrates a block diagram of a source assembly, in accordance with an embodiment.

FIG. 4 illustrates a cross section 400 of the source assembly 310, in accordance with an embodiment. The controller 330 provides imaging instructions which may include clock signals and pixel data to a driving circuit 410. The driving circuit 410 modulates the pixel data and generate driving signals to drive the light source 340 to generate light in accordance with imaging instructions from a controller 330.

The light source 340 may generate a spatially coherent or a partially spatially coherent image light. The light source 340 may include multiple light emitters. The light emitters can be microLEDs (μLEDs), vertical cavity surface emitting laser (VCSEL) devices, light emitting diodes (LEDs), tunable lasers, and/or some other light-emitting devices. In one embodiment, the light source 340 includes a matrix of microLEDs. The light source 340 emits light in a visible band (e.g., from about 390 nm to 700 nm). The light source 340 emits light in accordance with one or more illumination parameters set by or received from the controller 330. An illumination parameter is an instruction used by the light source 340 to generate light. An illumination parameter may include, e.g., source wavelength, pulse rate, pulse amplitude, beam type (continuous or pulsed), other parameter(s) that affect the emitted light, or some combination thereof. The light source 340 emits source light 420. In some embodiments, the source light 420 includes multiple beams of Red light, Green light, and Blue light, or some combination thereof.

The optics system 345 includes one or more optical components that condition the light from the light source 340. Conditioning light from the light source 340 may include, e.g., expanding, collimating, adjusting orientation in accordance with instructions from the controller 330, some other adjustment of the light, or some combination thereof. The one or more optical components may include, e.g., lenses, mirrors, apertures, gratings, or some combination thereof. Light emitted from the optics system 345 is referred to as an image light 355. The optics system 345 outputs the image light 355 at a particular orientation (in accordance with the imaging instructions) toward the output waveguide 320 (shown in FIG. 3).

The optics system 345 may include a light conditioning assembly 430 and an optical assembly 450. The light conditioning assembly 430 conditions the source light 420 and emits conditioned light 440 to the optical assembly 450. The conditioned light 440 is light conditioned for incidence on the optical assembly 450. The light conditioning assembly 430 includes one or more optical components that condition the light from the light source 340. Conditioning light from the light source 340 may include, e.g., expanding, collimating, correcting for one or more optical errors (e.g., field curvature, chromatic aberration, etc.), some other adjustment of the light, or some combination thereof. The light conditioning assembly 430 conditions the source light 420 and emits the conditioned light 440 to the optical assembly 450.

The optical assembly 450 redirects image light via its one or more reflective and/or refractive portions. Where the image light is redirected toward is based on specific orientations of the one or more reflective and/or refractive portions. In some embodiments, the optical assembly 450 includes a waveguide that directs the conditioned light 440 to a display area viewed by the user, or to another waveguide such as the output waveguide 320 illustrated in FIG. 3. In some embodiments, the optical assembly 450 includes one or more scanning mirrors able to perform a raster scan (horizontally, or vertically), a biresonant scan, or some combination thereof. In some embodiments, the optical assembly 450 may perform a controlled vibration along the horizontal and/or vertical directions with a specific frequency of oscillation to scan along two dimensions and generate a two-dimensional projected line image of the media presented to user's eyes. In other embodiments, the optical assembly 450 may also include lens that serve similar or same function as one or more scanning mirror. In some embodiments, the optical assembly 450 includes a galvanometer mirror. For example, the galvanometer mirror may represent any electromechanical instrument that indicates that it has sensed an electric current by deflecting a beam of image light with one or more mirrors. The galvanometer mirror may scan in at least one orthogonal dimension to generate the image light 355. The image light 355 from the galvanometer mirror represents a two-dimensional line image of the media presented to the user's eyes.

The controller 330 controls the operations of light source 340 and the optical assembly 450. The operations performed by the controller 330 includes taking content for display, and dividing the content into discrete sections. The controller 330 instructs the light source 340 to sequentially present the discrete sections using individual source elements corresponding to a respective row in an image ultimately displayed to the user. In embodiments where the optical assembly 450 comprises a scanning mirror, the controller 330 instructs the optical assembly 450 to scan the presented discrete sections to different areas of a coupling element of the output waveguide 320 (shown in FIG. 3). Accordingly, at the exit pupil of the output waveguide 320, each discrete portion is presented in a different location. While each discrete section is presented at different times, the presentation and scanning of the discrete sections occur fast enough such that a user's eye integrates the different sections into a single image or series of images. The controller 330 may also provide imaging instructions to the light source 340 that include an address corresponding to an individual source element of the light source 340 and/or an electrical bias applied to the individual source element.

The image light 355 couples to the output waveguide 320 as described above with reference to FIG. 3.

Waveguide and Viewing Plane

Figure 5:
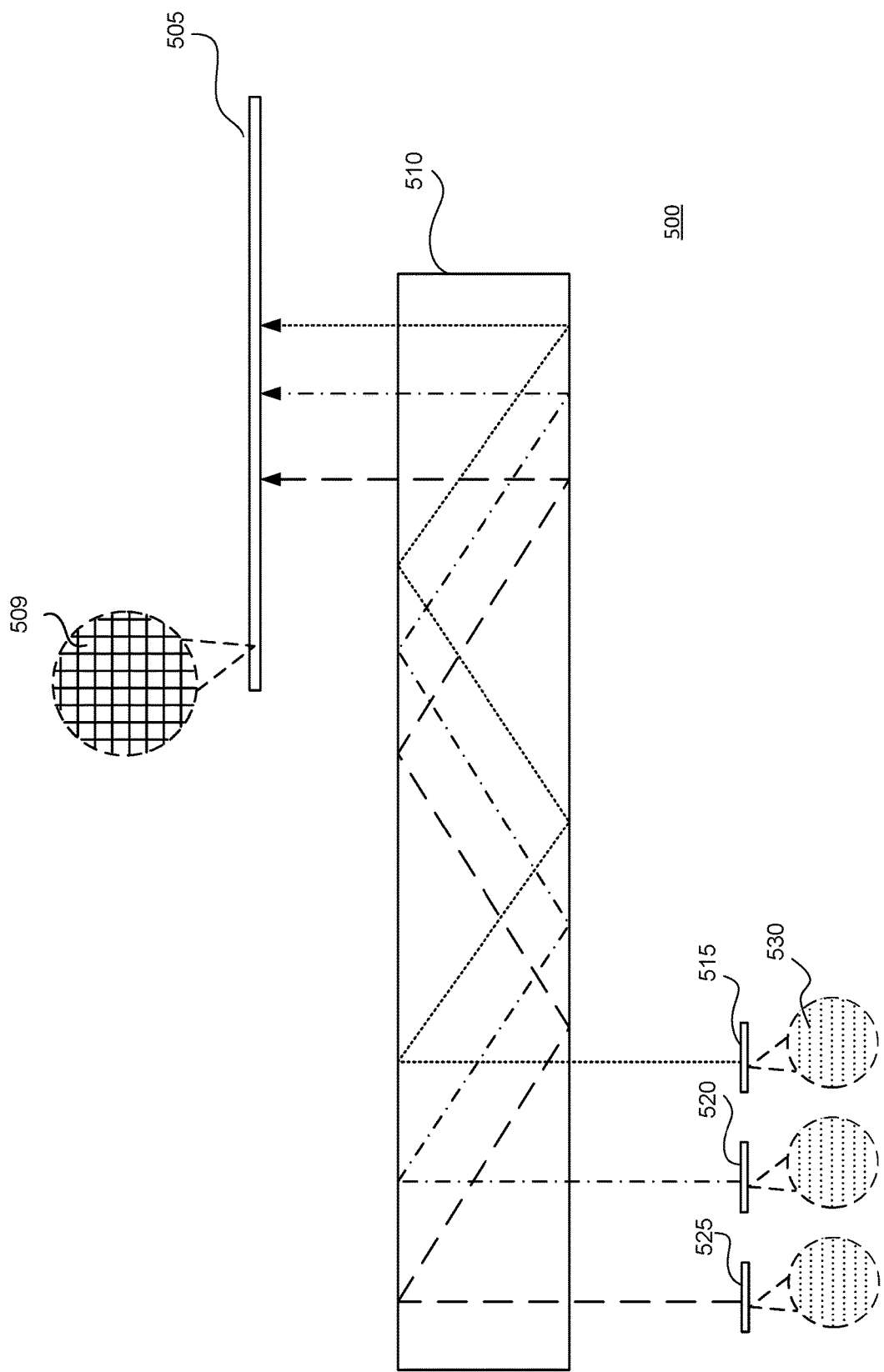
FIG. 5 illustrates a display device having a plurality of LED assemblies and a waveguide, in accordance with same embodiments.

FIG. 5 illustrates a display device 500 having a plurality of LED assemblies 515, 520, and 525 and a waveguide 510, in accordance with same embodiments. The display device 500 may correspond to the near-eye display 100 or another scan-type display device. The light source of the display device may comprise a plurality of LED assemblies 515, 520, and 525. Each LED assembly comprises an array of LEDs of a respective color channel. For example, the LED assemblies 515, 520, and 525 may correspond a red LED array, a green LED array, and a blue LED array, respectively. The LED assemblies may collectively correspond to the light source 340 shown in FIG. 4, or may be used in other display devices.

Each of the LED assemblies 515, 520, and 525 includes a 2-dimensional array of LEDs 530 that emit light. In some embodiments, each of the LEDs 530 may correspond to a pixel or a sub-pixel of the display. Before reaching the waveguide 510, the light may be conditioned by different optical devices such as the conditioning assembly 430 (shown in FIG. 4 but not shown in FIG. 5). The waveguide 510 guides and projects the light from the LED assemblies to the viewing plane 505. In some embodiments, the waveguide 510 aligns and/or combines the light emitted from each of the LED assembly 515, 520, and 525, such that light emitted from corresponding LEDs 530 of each LED assembly are combined to form a pixel of the display. The waveguide 510 may further magnify the emitted light, such that the light from the LED assemblies is fitted to the viewing plane 505.

The viewing plane 505 is an area that receives the light emitted from the LED assemblies. For example, the viewing plane 505 may correspond to a portion of the coupling element 350 or a portion of the decoupling element 360 in FIG. 3. In some cases, a viewing plane is not an actual physical structure but is an area to which the image light is projected and which the image is formed. The viewing plane 505 may be spatially defined by a matrix of pixel locations 509 in rows and columns. A pixel location 509 here refers to a single pixel. The pixel locations 509 (or simply the pixels) in the viewing plane 505 sometimes may not actually be additional physical structure. Instead, the pixel locations 509 may be spatial regions that divide the viewing plane 505. Also, the sizes and locations of the pixel locations may depend on the projection of the light from the LED assemblies. In some cases, a pixel location 509 may be subdivided spatially into subpixels (not shown). For example, a pixel location may include a Red subpixel, a Green subpixel, and a Blue subpixel. The Red subpixel corresponds to a location at which one or more Red light beams are projected, etc. When subpixels are present, the color of a pixel is based on the temporal and/or spatial average of the subpixels. In some embodiments, the number of rows and columns of LED array of each LED assembly may or be the same as the number of rows and columns of the pixel locations 509 in the viewing plane 505.

The terms rows and columns may describe two relative spatial relationships of elements. While, for the purpose of simplicity, a column described herein is normally associated with a vertical line of elements, it should be understood that a column does not have to be arranged vertically (or longitudinally). Likewise, a row does not have to be arranged horizontally (or laterally). A row and a column may also sometimes describe an arrangement that is non-linear. Rows and columns also do not necessarily imply any parallel or perpendicular arrangement. Sometimes a row or a column may be referred to as a line.

The display device may operate in predefined display periods. A display period may correspond to a duration of time in which an image is formed. For example, a display period may be associated with the frame rate (e.g., a reciprocal of the frame rate).

While the embodiments of display devices in FIGS. 3-5 are shown to include a waveguide and an optical assembly, other embodiments of display devices may omit the waveguide and/or the optical assembly. For example, in some embodiments, the light emitters may be arranged in a two-dimensional matrix that project light directly onto an image field without going through an optical assembly. In one of those embodiments, the light emitters may project simultaneously onto the entire image field without scanning. An optical assembly that magnifies the dimensional of the image may or may not be used, depending on the implement. Likewise, in one embodiment, a screen may be used in place of a waveguide. In embodiments, a display period may be referred to a frame. The rate of changing of the display period may be referred to the frame rate.

Led Assembly

As discussed above with reference to FIG. 5, in some embodiments, the light source for a display (e.g., the light source 340 for an NED 100) may comprise one or more LEDs. In some embodiments, the one or more LEDs are arranged into an LED assembly or array. For example, the light source may comprise a plurality of LEDs arranged in a linear arrangement, a two-dimensional matrix arrangement, and/or the like. In some embodiments, the light source may comprise a plurality of LED assemblies 515, 520, 525, each corresponding to a different color channel (e.g., a first LED assembly corresponding to a red color channel, a second LED assembly corresponding to a green color channel, and a third LED assembly corresponding to a blue color channel).

Figure 6A:
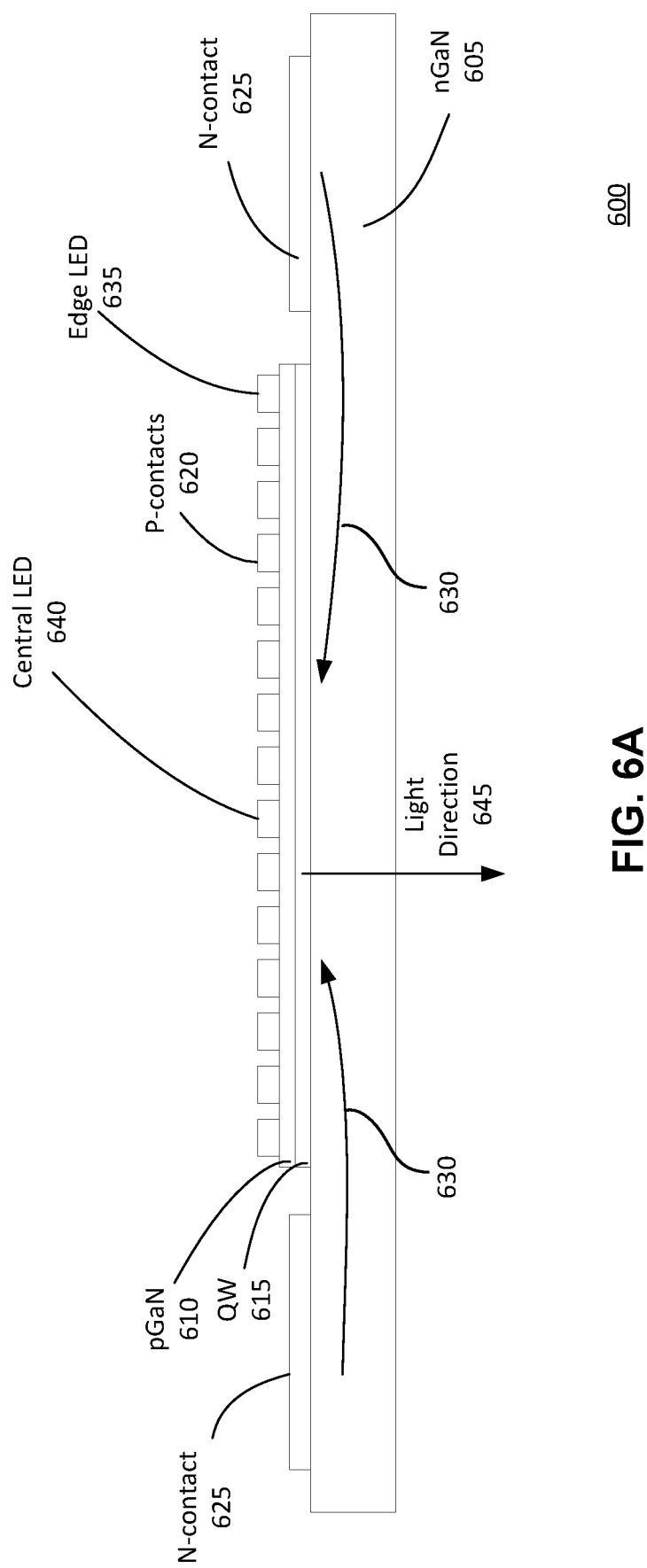
FIG. 6A illustrates a cross-sectional view of an LED assembly, in accordance with some embodiments.

FIG. 6A illustrates a side view of an LED assembly, in accordance with some embodiments. The LED assembly 600 may correspond to any of the LED assemblies 515, 520, and 525 illustrated in FIG. 5. The LED assembly 600 comprises a substrate structure having formed thereon a plurality of contacts. The substrate structure (hereinafter also referred to as an epitaxial structure or epitaxial LED structure) may comprise a semiconductor structure including an n-type layer 605 (e.g., an n-type substrate), a p-type layer 610 (e.g., a p-type substrate), and a quantum well (QW) material 615 (also referred to as a light emitting layer or layer of light emitting material) between the n-type layer 605 and the p-type layer 610. In some embodiments, the n-type and p-type layers may comprise n-type gallium nitride (nGaN) and p-type GaN (pGaN) respectively, although it is understood that in other embodiments other type of materials may be used. In some embodiments, the semiconductor structure of the LED assembly 600 including the n-type layer 605, quantum well material 615, and p-type layer 610 is an epitaxial structure grown on a growth substrate. Although FIG. 6A illustrates the LED assembly 600 as a particular shape (e.g., rectangular), it is understood that in some embodiments, the LED assembly 600 may be formed into a different shape.

Figure 6B:
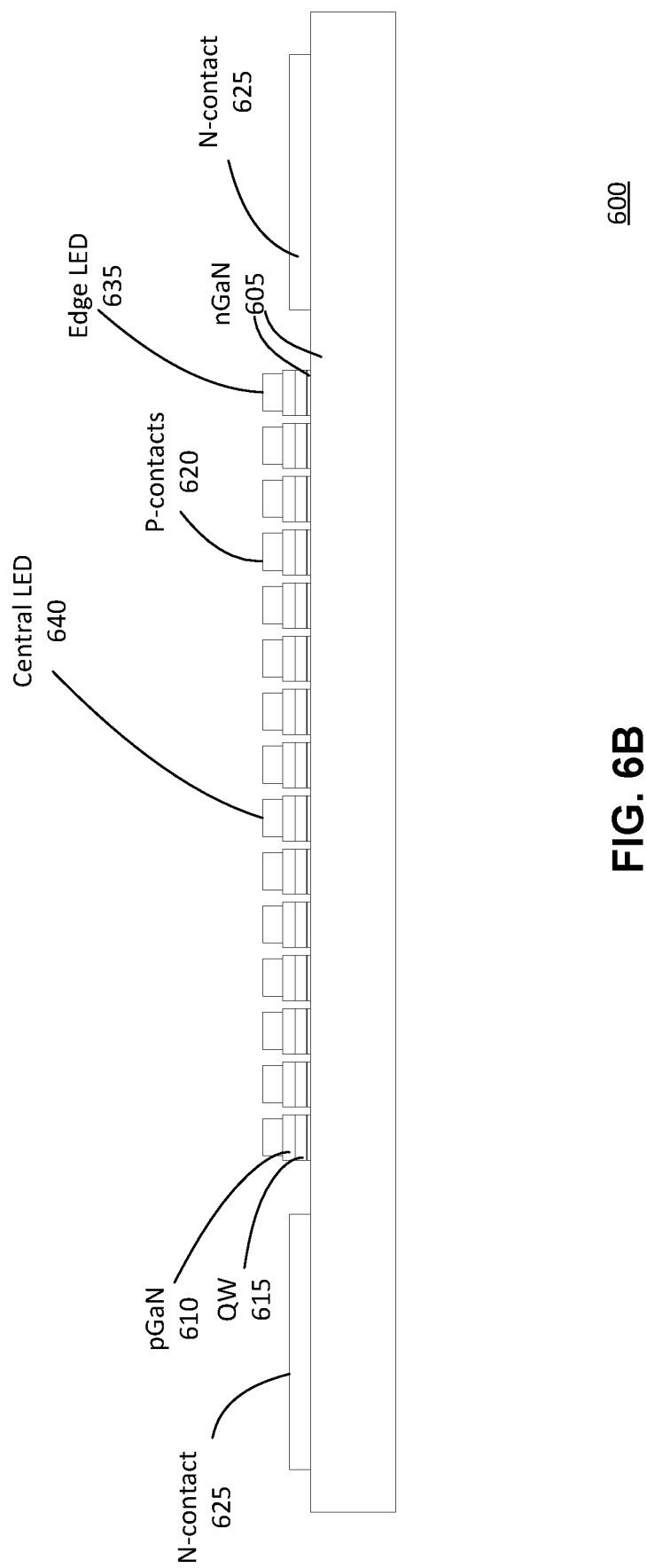
FIG. 6B illustrates a cross-sectional view of another LED assembly, in accordance with some embodiments.

The LED assembly 600 further includes a plurality of p-contacts 620 on the p-type layer 610, and one or more n-contacts 625 on the n-type layer 605. In some embodiments, the LED assembly 600 is a flip-chip LED assembly where the contacts of the LEDs are on the same side of the substrate. As illustrated in FIG. 6A, the p-contacts 620 of the LED assembly 600 may be disposed on a common p-type layer 610 and quantum well material 615. It is understood that in other embodiments, the p-contacts 620 may be formed on different p-type layer and/or quantum well material sections (e.g., the p-type layer and/or quantum well material shaped into one or more mesas or other structures). For example, FIG. 6B illustrates a side view of another LED assembly, in accordance with some embodiments. The sideview is of the LED assembly of FIG. 6B is similar to that of FIG. 6A, but where the LEDs are etched or partially etched into mesas. As illustrated in FIG. 6B, each LED (corresponding to a p-contact 620) is formed on a mesa comprising p-type material 610 (e.g., pGaN) and quantum well material 615, instead of on a single p-type layer and quantum well layer as illustrated in FIG. 6A. While the following figures may, for convenience, illustrate LED assemblies where the p-contacts are located on a common p-type and quantum well layer as illustrated in FIG. 6A, it is understood that the structures and concepts discussed can also be applied to the architecture illustrated in FIG. 6B with the p-contacts located on mesas. It is also understood that in some other embodiments, instead of each p-contact being formed on a separate mesa, multiple LEDs may be formed on a single mesa.

Because the number of p-contacts 620 in the LED assembly 600 may exceed the number of n-contacts 625, multiple p-contacts 620 may be operated by current between the p-contacts 620 and a particular n-contact 625. In some cases, such an arrangement may be used to produce a compact arrangement of LEDs, since a large number of LEDs of the assembly 600 will share the same n-contact 625, and can be arranged closely together. While FIGS. 6A and 6B illustrate the p-contacts 620 arranged in a linear arrangement, the p-contacts 620 may be arranged in a two-dimensional matrix, or some other arrangement.

During operation of the LED assembly 600 a current is applied between the p-contacts 620 and the n-contacts 625, causing a voltage difference between p-contacts and n-contacts. The quantum well material 615 defines an active light emitting area of the LED assembly 600. For example, a portion of the quantum well material 615 associated with each p-contact 620 may emit light based upon an amount of current flowing through the corresponding p-contact 620. Light emitted in a direction away from the p-contacts 620 (e.g., through the n-type layer 605) may form the light emission of the LED assembly 600 (e.g., the source light 420 of FIG. 4). Because the light emitted by the LEDs passes through the n-type layer 605, the n-type layer 605 is formed to be optically transparent or partially transparent. In some embodiments, reflective material (not shown) may be disposed on a side of the LED assembly 600 having the p-contacts 620, in order to reflect additional light towards the n-type layer 605, directionalizing the light and increasing the brightness level of the light output by the LED assembly 600. In some embodiments, a patterned transparent layer (not shown) may be disposed on the nGaN side of the LED assembly to enhance light extraction and collimation. The p-contacts 620 are individually addressable, allowing for operation of individual LEDs with the LED assembly in accordance with received imaging signals.

In some embodiments, the LED assembly is a microLED assembly, wherein each p-contact 620 corresponds to a μLED. The feature size of each μLED (e.g., the diameter) may range from sub-micrometers to tens of micrometers (e.g., from 0.1 μm to 20 μm). The pitch of the LED assembly 600 (e.g., spacing between μLEDs) may range from sub-micrometers to tens of micrometers. Each μLED may correspond to a pixel or sub-pixel of a display.

As shown in FIGS. 6A and 6B, when an LED assembly 600 contains an array of LEDs sharing a smaller number of n-contacts, the distance between p-contacts and n-contacts may be different for different LEDs of the array. For example, FIGS. 6A and 6B illustrate an edge LED 635 corresponding to an LED near the edge of the LED array that is close to an n-contact 625, and a central LED 640 corresponding to an LED near the center of the LED array that has a farther distance to the nearest n-contact 625 of the LED assembly.

These different distances between n-contact and p-contact for the LEDs of the LED assembly 600 may create a current crowding problem. For example, in order to turn on the LEDs of the LED assembly, current 630 has to spread from the n-contacts 625 through the n-type layer 605 to the farthest LEDs of the LED assembly. When most LEDs are turned on, a large current flows through the n-side, and, in the case of the center LED, the current has to go through a longer distance to reach the center LED than the edge LED. Since the n-GaN layer has a finite resistance, and that voltage scales with distance, the voltage will be higher for the center LED than for the edge LED. This increased voltage level is undesirable for the back plane electronics of the LED assembly, and may also lead to increased power consumption. This problem may be significant for displays in which the distance between the n-contacts 625 to the farthest LEDs of the LED assembly (e.g., the central LED 640) can be many millimeters.

LED Assembly with Trenches

Figure 7:
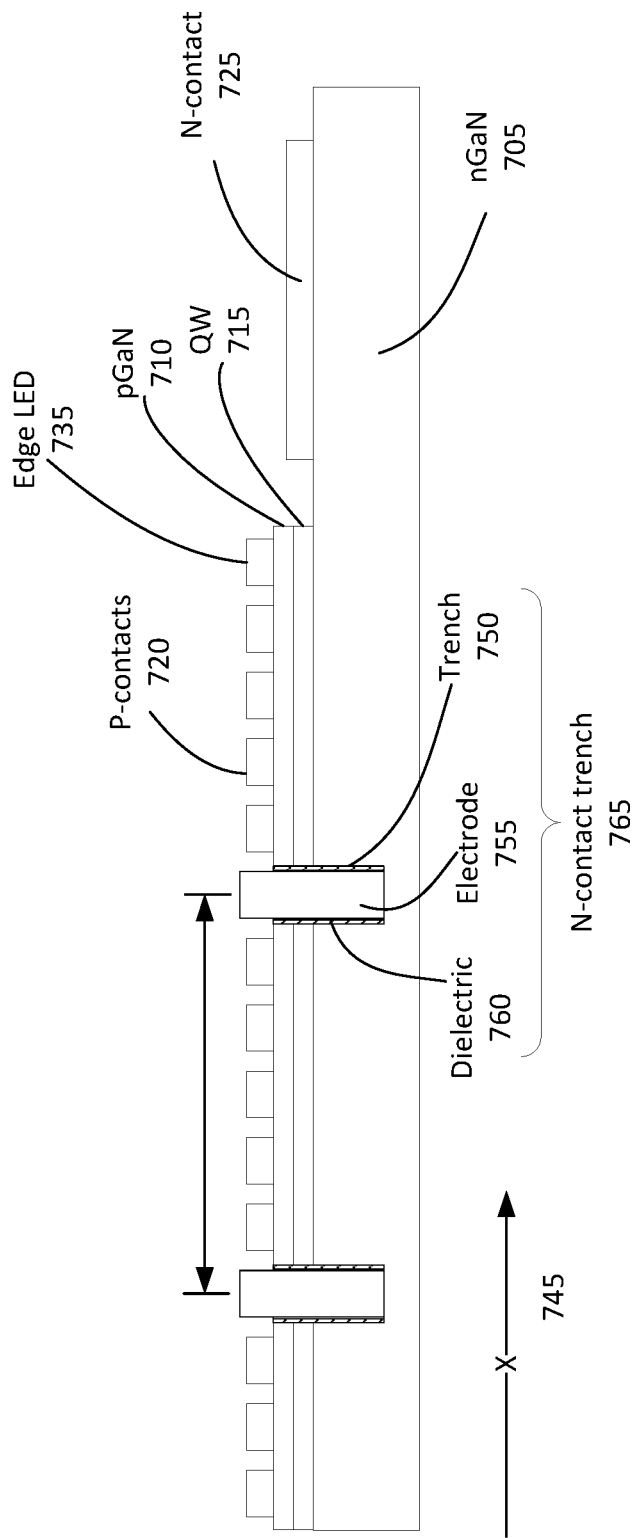
FIG. 7 illustrates a cross-sectional view of a portion of an LED assembly having a plurality of trenches formed in the pixel array, in accordance with some embodiments.

FIG. 7 illustrates a cross-sectional view of a portion of an LED assembly having a plurality of trenches formed in the pixel array, in accordance with some embodiments. Although the LED assembly 700 as illustrated in FIG. 7 only shows a single n-contact 725 on one side of the array of p-contacts 720, in some embodiments, the LED assembly 700 may comprise multiple n-contacts, which may be arranged on any side of the array of p-contacts (e.g., similar to the LED assembly 600 illustrated in FIG. 6A or 6B). Although FIG. 7 shows an architecture where pixels are defined by p-contacts, in some embodiments, the LED assembly may comprise pixels formed with mesas, e.g., where the p-side and active region, and n-side and etched or partially etched between the pixels.

The LED assembly 700 comprises a plurality of trenches 750 formed within the LED array (e.g., within the display area defined by the LED array). Each of the trenches 750 is formed through the p-layer 710 and the quantum wells 715 of the LED assembly, allowing an electrode 755 within each trench to contact the n-type substrate 705 of the LED assembly. Each of the electrodes 755 corresponds to an n-type contact (e.g., similar to the n-type contact 725). In some embodiments, a portion of each electrode 755 (e.g., a top portion or top surface) may comprise the same material as the n-contact 725, while a remaining bulk of the electrode (the pillar portion of the electrode) may comprise a plated metal or a tunnel junction contact. In some embodiments, a layer of dielectric material 760 is disposed between the side surfaces of the trenches 750 and the corresponding electrodes 755, separating the electrodes 755 from the side surfaces of the trenches 750 and preventing contact between the electrodes 755 and the p-layer 710 and quantum well layer 715 of the LED array. For ease of discussion, as used herein, a trench 750 and its corresponding electrode 755 may be collectively referred to as an "n-contact trench" 765.

In some embodiments, each n-contact trench 750 may be sized based upon the size of one pixel (e.g., one LED) of the LED array. For example, as illustrated in FIG. 7, each n-contact trench 765 occupies a space similar to that of a p-contact 720 within the LED array. As such, n-contact trenches 765 may be formed in the LED array by "sacrificing" one or more pixels within the LED array.

In embodiments where a display comprises overlaid light from a plurality of LED assemblies (e.g., corresponding to different color channels), such as the viewing plane 505 illustrated in FIG. 5, the n-contact trenches of each of the LED assemblies may be in different locations of the LED array. This may be done to minimize an impact of the n-contact trenches (which do not emit light) on the overall visual quality of displayed images, by preventing "dead" pixels within the display (e.g., pixels corresponding to trenches on each LED assembly, thus receiving no light). In some embodiments, because the n-contact trenches in each LED assembly may be in known locations within the LED array, the controller 330 may automatically adjust the imaging instructions for each LED assembly to compensate for the n-contact trenches within the LED array. For example, in some embodiments, for a given image to be displayed by the LED assembly, the controller 330 may adjust the imaging instructions such that LEDs corresponding to pixels near each n-contact trench emit light of increased intensity to compensate for the pixel in which the n-contact trench is located (which emits no light).

The n-contact trenches 765 are arranged at various locations within the LED array, decreasing a maximum distance between an LED of the LED array and the nearest n-contact. In some embodiments, the n-contact trenches 765 are spaced at regular intervals within the LED array.

Figure 8A:
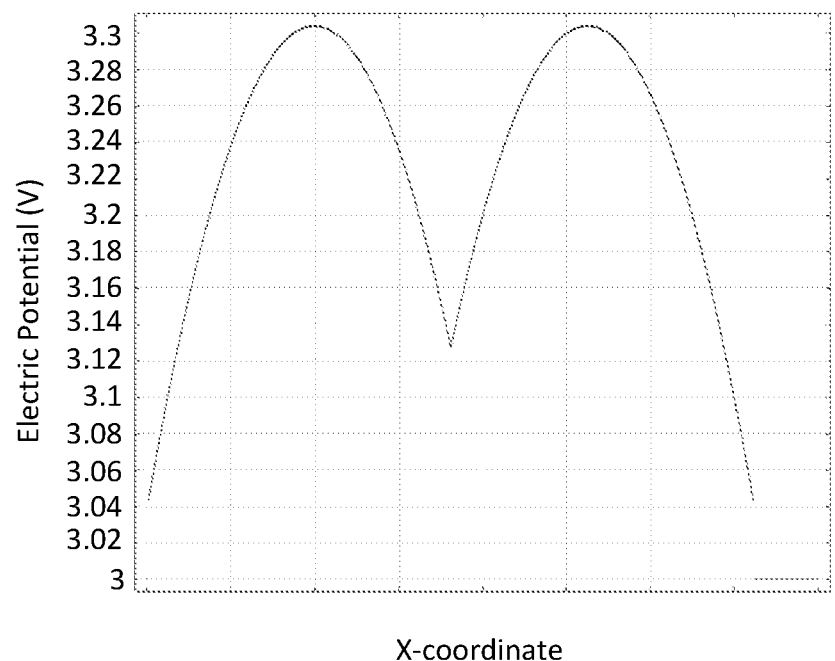
FIGS. 8A, 8B, and 8C are graphs illustrating voltage differences for LEDs at different locations within a row of a LED array for different frequencies of n-contact trenches, in accordance with some embodiments.
Figure 8B:
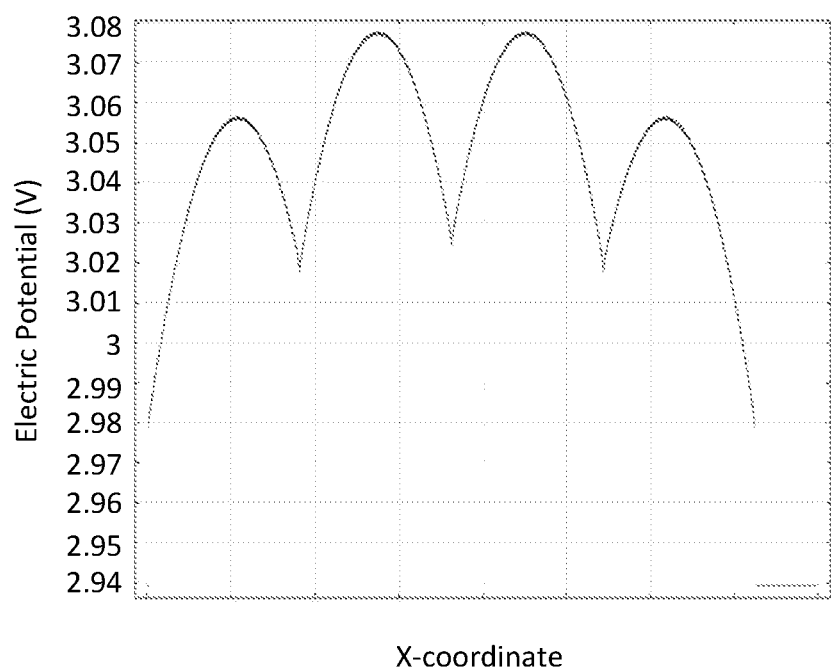
Figure 8C:
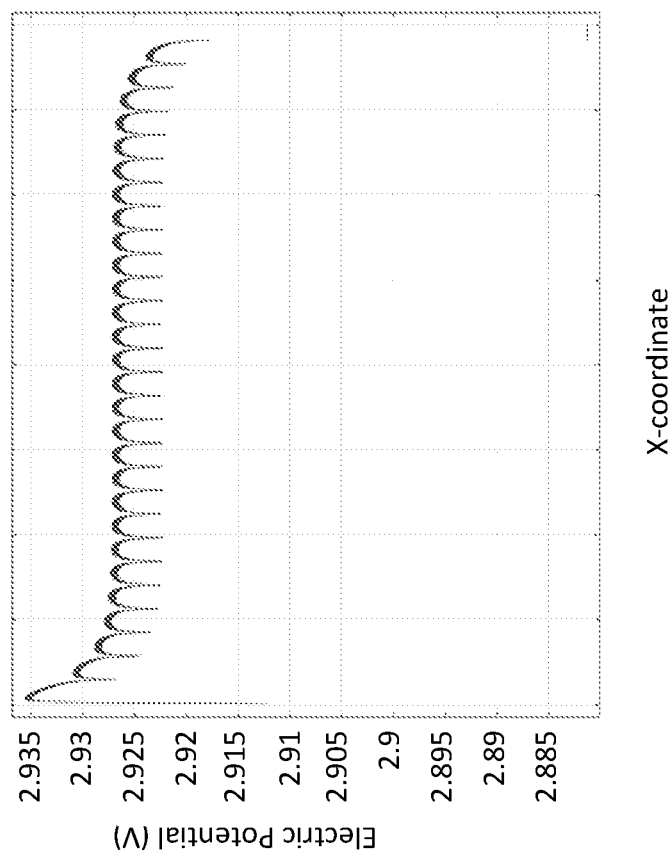

FIGS. 8A, 8B, and 8C are graphs illustrating voltage differences for LEDs at different locations within a row of an LED array for different frequencies of n-contact trenches, in accordance with some embodiments. The results illustrated in FIGS. 8A-8C were obtained through simulations and should show qualitative trends. Each of the graphs illustrated in FIGS. 8A-8C has an x-axis corresponding to an x-coordinate along a length of the LED assembly, as illustrated by the x-axis 745 of the LED assembly 700 of FIG. 7, from a location of a first LED of the LED assembly nearest an n-contact on one edge of the LED array, and increasing distance along the x-axis correspond to increasing distance across one dimension of the LED array. The y-axis of each graph indicates a voltage needed to drive each LED of the LED assembly with a constant current density for each pixel at different positions along the x-axis. Each of the LED assemblies used to produce the results illustrated in FIGS. 8A-8C has an n-contact on each side of the LED array along the x-axis, and one or more n-contact trenches within the LED array at regular intervals along the x-axis.

FIG. 8A is a graph showing voltage across the LED array of an LED assembly having one n-contact trench within the row of the LED array (i.e., halfway across the row). FIG. 8B is a graph showing voltage across the LED array of an LED assembly having three n-contact trenches spaced at uniform intervals across the row of the LED array. FIG. 8C is a graph showing voltage across the LED array of an LED assembly having 27 n-contact trenches spaced at uniform intervals across the row of the LED assembly. As illustrated in the graphs of FIGS. 8A-8C, even a low frequency of n-contact trenches can greatly reduce a voltage difference between middle and edge LEDs of the LED array and increase current spread between the contacts of the LED assembly. In addition, a larger number of n-contact trenches (resulting in a smaller distance between n-contact trenches) may increase the reduction in voltage difference between LEDs of the LED array. However, in some embodiments, a number of n-contact trenches that can be formed in the LED array may be limited by an amount of current able to be tolerated by the trenches. That is, if the number of n-contact trenches are too few, excessive amount of current may flow in the n-contact trenches and cause the temperature to rise excessively. In some embodiments, the number and arrangement of n-contact trenches within the LED array is configured to achieve a maximum voltage difference between the LEDs of the LED array that is less than a predetermined amount (e.g., 0.5V).

In some embodiments, one or more n-contact trenches are formed within the LED array of the LED assembly without sacrificing pixels of the LED array. In some embodiments, in order to accommodate an n-contact assembly within the LED array, the p-contacts of one or more LEDs of the LED array may be reduced in size and/or spaced differently in comparison to other p-contacts in the LED array.

Figure 9A:
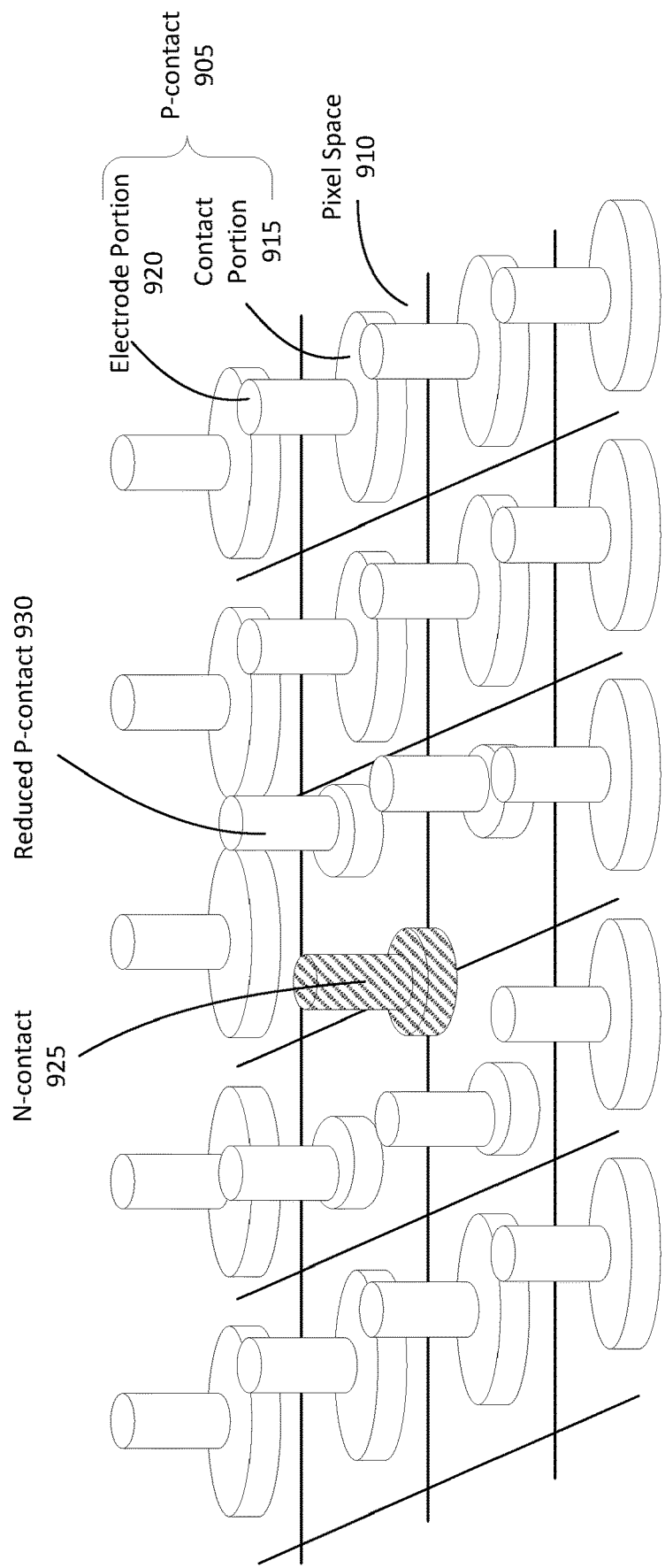
FIGS. 9A and 9B illustrate a portion of an LED array containing an n-contact trench, in accordance with some embodiments.
Figure 9B:
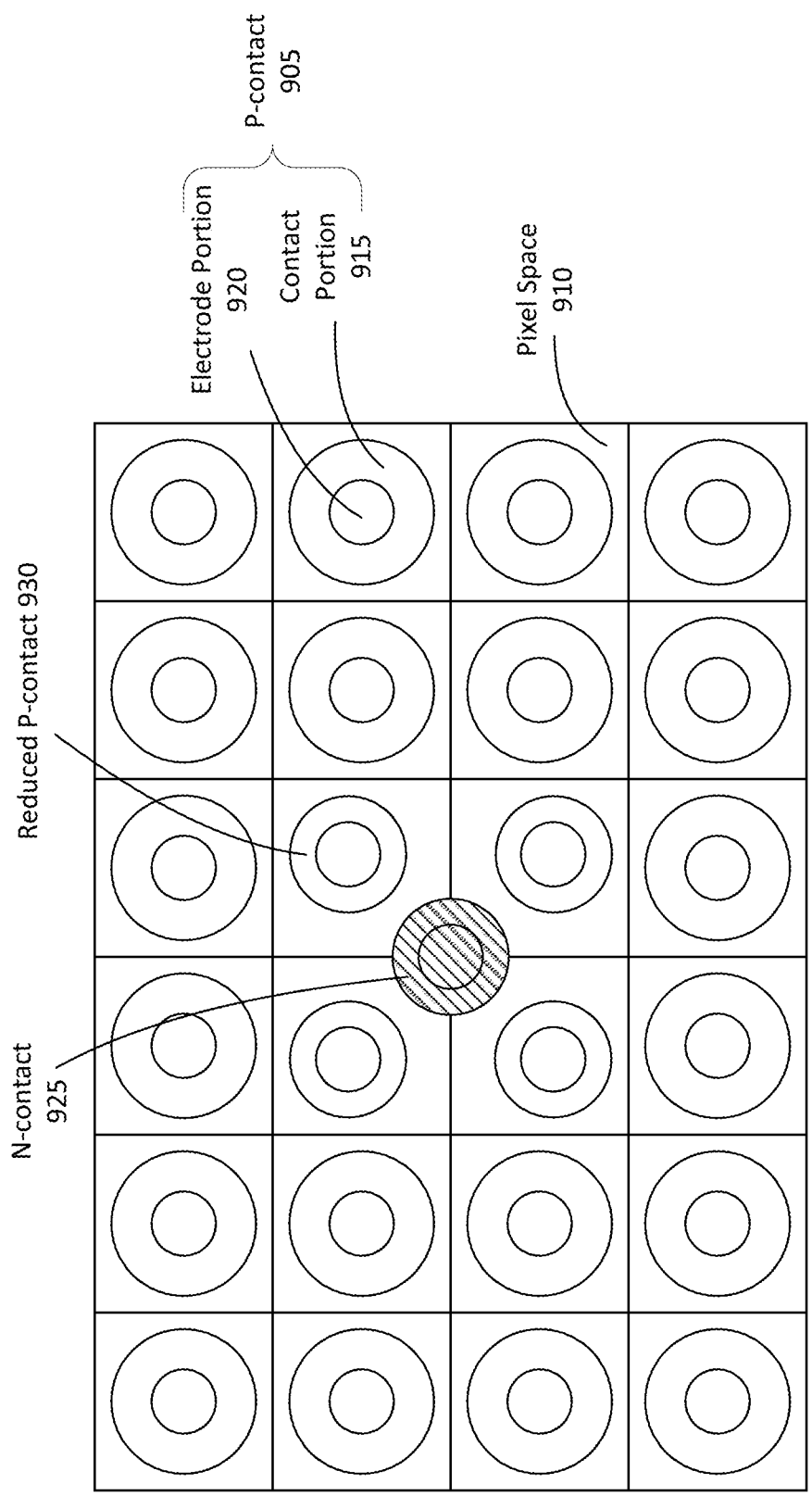

FIGS. 9A and 9B illustrate a portion of an LED array containing an n-contact trench 925, in accordance with some embodiments. FIG. 9A illustrates a perspective view of the portion of the LED array, while FIG. 9B illustrates a top-down view. The LED array comprises a plurality of LED p-contacts 905, each corresponding to a pixel of the LED array. As illustrated in FIG. 9A, the LED p-contact 905 occupies a pixel space 910, corresponding to a physical portion of the LED array corresponding to a pixel of the LED array. The pixel spaces 910 may be uniformly spaced, with most of the p-contacts 905 each be centered on their respective pixel space, to create a uniform array of pixels. In some embodiments, each of the p-contacts 905 may comprise a contact portion 915 and an electrode portion 920.

In order to accommodate an n-contact 925, certain p-contacts of the LED array may be reduced in size (hereinafter referred to as reduced p-contacts 930). In some embodiments, each reduced p-contact 930 has a smaller contact portion in comparison with the normally-sized p-contacts 905 of the LED array. By reducing a contact size of the reduced p-contacts 930, an area between them may be made available to allow a through-via (e.g., ultra-fine pitch through-via) for an n-contact 925 to be formed between them.

In addition, in some embodiments, each of the reduced p-contacts 930 may be positioned off-center in their respective pixel space 910. This may be done to create additional physical space within the LED array between the reduced p-contacts 930 to allow for the n-contact 925 to be formed between them. For example, as illustrated in FIGS. 9A and 9B, four reduced p-contacts 930 of adjacent pixel spaces are formed in the LED array, allowing for the n-contact 925 to be formed in a space at a center of the four adjacent pixel spaces. As such, an n-contact 925 can be formed in the LED array without reducing the number of LEDs (corresponding to p-contacts) of the LED array.

Figures 10A, 10B:
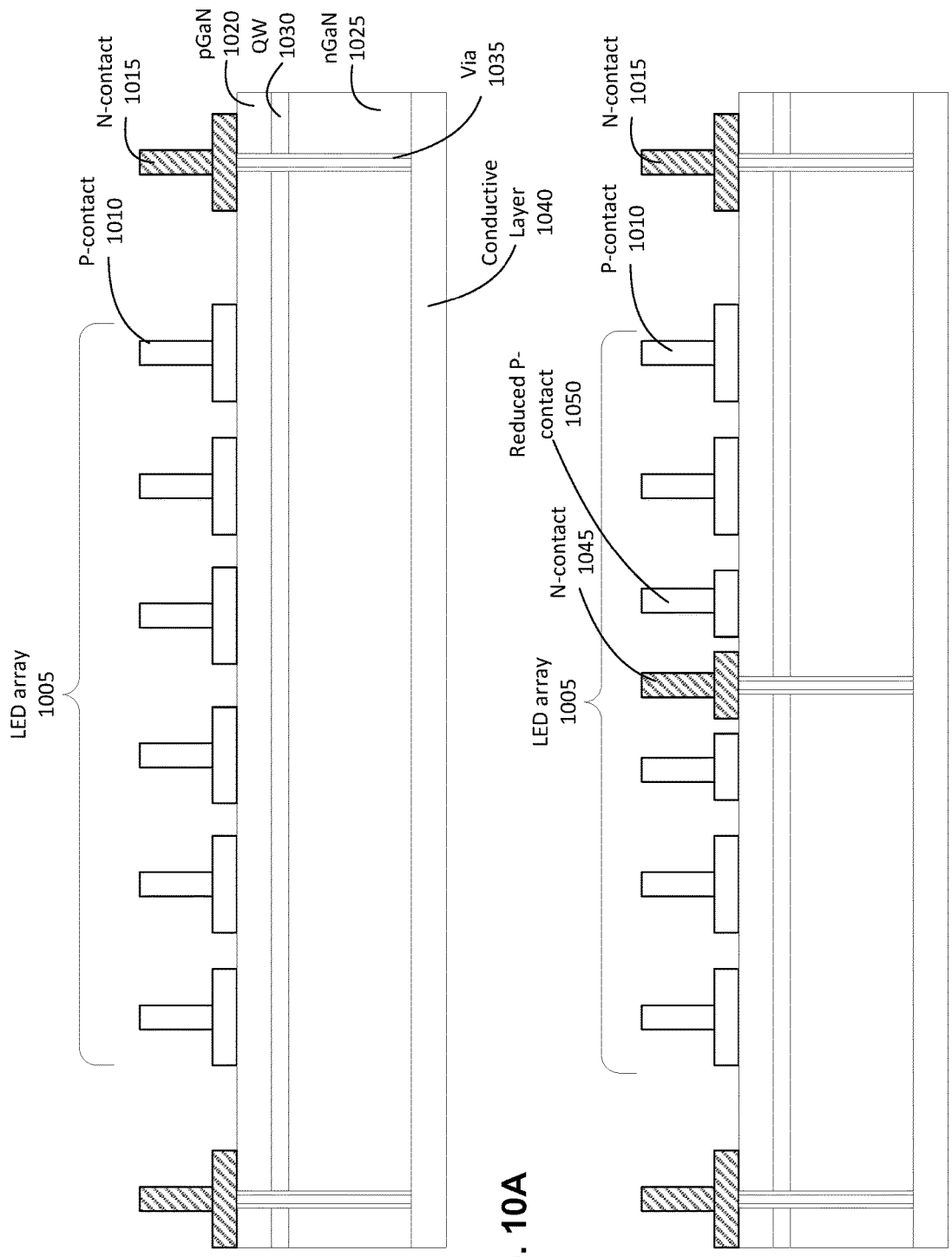
FIGS. 10A and 10B illustrate side views of LED assemblies having an LED array, in accordance with some embodiments.

FIGS. 10A and 10B illustrate side views of LED assemblies having an LED array, in accordance with some embodiments. FIG. 10A illustrates a side view of an LED assembly with an LED array without any n-contacts. FIG. 10B illustrates a side view of an LED assembly having an LED array with an n-contact formed within.

The LED assemblies illustrated in FIGS. 10A and 10B each comprises an LED array 1005 having an array of p-contacts 1010, each corresponding to an LED of the array. The p-contacts 1010 of the LED array 1005 are formed on the p-type layer 1020, which is separated from the n-type layer 1025 by quantum well material 1030. One or more n-contacts 1015 are formed near the peripheral edges of the array. As illustrated in FIGS. 11A and 11B, the n-contacts 1115 may be formed on the p-type substrate 1020 of the LED assembly, and connected to the n-type substrate 1025 of the array via one or more vias 1035. In some embodiments, the LED assembly comprises a conductive layer or mesh 1040 made from a conductive oxide material (such as indium tin oxide, or ITO) formed on a surface of the n-type substrate 1025 (e.g., opposite from the p-type substrate 1020 and quantum well material 1030) to facilitate current spread through the n-type substrate 1025 and to the p-contacts 1010 of the LED array 1005. The vias 1035 of the n-contacts 1015 may electrically connect the n-contacts 1015 to the conductive layer 1040, forming a network of n-contacts and allowing current to spread from the n-contacts 1015 through the conductive layer 1040 and to the n-type substrate 1025 and p-contacts 1010. In other embodiments, the n-contacts 1015 may be connected directly to the n-type layer 1025 through one or more trenches (e.g., similar to the trenches 750 illustrated in FIG. 7). In other embodiments, the n-contacts 1015 may be formed directly on the n-type substrate 1025 (e.g., similar to that illustrated in FIGS. 6 and 7).

As illustrated in FIG. 10A, the p-contacts 1010 of the LED array 1005 are evenly spaced within the row to create a substantially uniform row of pixels. In some embodiments, the LED assembly may comprise pixels formed with mesas, where the p-side and active region, and n-side and etched or partially etched between the pixels (e.g., as illustrated in FIG. 6B).

However, as illustrated in FIG. 10B, to accommodate the additional n-contact 1045 formed between the p-contacts 1010 within the LED array 1005, the p-contacts adjacent to the n-contact 1045 in the row (e.g., reduced p-contacts 1040) have contacts of reduced size, and are shifted in position to create the necessary space to accommodate the n-contact 1045. In some embodiments, the adjacent p-contacts 1050 are reduced in size and shifted without affecting the positioning of other p-contacts within the row. While FIG. 10B illustrates two p-contacts reduced in size and shifted in location to accommodate the n-contact, in other embodiments, the shifting of the adjacent p-contacts to accommodate the n-contact may necessitate reduction in contact size and/or shifting of position of other p-contacts within the row. In some embodiments, a reduction in contact size and/or shift in position may be reduced for each subsequent p-contact farther away from the n-contact. While FIG. 10B illustrates one n-contact 1045 placed within one row of the LED array, it is understood that in other embodiments, the LED array may have a different number of n-contacts, which may be placed in different locations within the LED array.

By including n-contacts within the LED array, the voltage difference between different LEDs during operation of the LED assembly can be reduced, increasing current spread to the LEDs. In addition, by forming the n-contacts between the p-contacts by adjusting a size and/or position of adjacent p-contacts, the lower voltage difference can be achieved without sacrificing any pixels of the display.

In some embodiments, due to the p-contacts near the n-contacts within the LED array having different sizes and/or positions to accommodate the n-contact, light emitted by the LED array may be distorted due to the differences in size and/or location. Because the locations of the n-contacts within the LED array and how the p-contacts have been adjusted to accommodate them can be known by a controller, the controller may, when generating imaging instructions for the LED assembly to display received image data, adjust the received image in software in order to mitigate the distortion. In addition, in embodiments where a plurality of LED assemblies are overlaid on each to form a display (e.g., each LED assembly corresponding to a color channel of the display), the locations of n-contacts within each of the plurality of LEDs may be offset, in order to reduce an amount of distortion at a single location.

Process Flow

Figure 11:
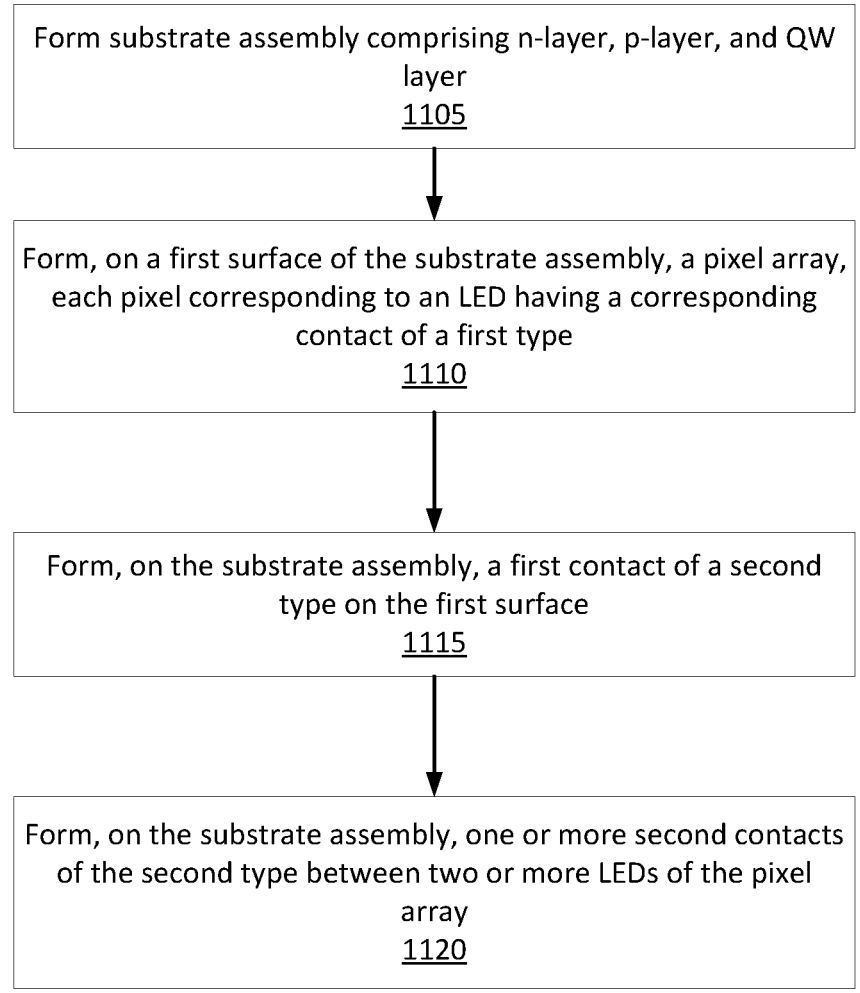
FIG. 11 is a flowchart of a process for manufacturing an LED assembly having one or more n-contacts with the LED array.

FIG. 11 is a flowchart of a process for manufacturing an LED assembly having one or more n-contacts within the LED array, in accordance with some embodiments. In some embodiments, the method 1100 may be performed by an LED assembly manufacturing system.

The manufacturing system forms 1105 a substrate assembly (e.g., an epitaxial structure) having a p-type substrate layer (e.g., pGaN), n-type substrate layer (e.g., nGaN), and a layer of quantum well material disposed between the p-type and n-type layers. In some embodiments, the epitaxial structure is formed on a base substrate (e.g., a sapphire substrate).

The manufacturing system forms 1110, on the substrate assembly, a pixel array (also referred to as an LED array) on a first surface of the epitaxial structure (e.g., surface of the p-type layer). Each pixel of the pixel array corresponds to an LED having a corresponding contact of a first type (e.g., p-contact). In some embodiments, the p-type layer and quantum well layer are etched or partially etched between each of LEDs to form a mesa array. In some embodiments, the p-contacts of the pixel array are arranged such that p-contacts within one or more first portions of the pixel array have larger spacing in comparison to p-contacts within one or more second portions of the pixel array. In some embodiments, the p-contacts within the one or more first portions of the pixel array may be reduced in size and/or number in order to accommodate the larger spacing. In some embodiments, a subset of the p-contacts within the pixel array have reduced size in comparison to other p-contacts within the pixel array.

The manufacturing system forms 1115, on the substrate assembly, at least one contact of a second type (e.g., n-contact) on a surface of the n-type layer of the substrate assembly. In some embodiments, the first surface of the epitaxial structure is formed to expose the n-type layer outside the p-type and quantum well layers, whereupon the n-contact is formed on the exposed n-type layer. In other embodiments, the n-contact may be connected to the n-type layer by a via. In some embodiments, the n-contact is formed adjacent to the pixel array (e.g., outside the pixel array).

The manufacturing system forms 1120, on the substrate assembly, one or more additional contacts of the second type (e.g., additional n-contacts) between two or more LEDs of the pixel array (e.g., between two or more p-contacts of the pixel array). Each of the additional n-contacts may be formed in a trench through the p-layer and quantum well layer to reach the p-layer. In some embodiments, the additional n-contacts formed within the pixel array are formed between p-contacts of the pixel array within the one or more first portions having larger spacing. For example, one or more of the additional n-contacts may be formed in a space within the pixel array that would otherwise be occupied by an LED, reducing a total number of LEDs that would otherwise be in the pixel array. In other embodiments, one or more of the second contacts are placed between LEDs of the pixel array, wherein the contacts of one or more of the adjacent LEDs are reduced in size and/or shifted in location (e.g., having larger spacing between them) to accommodate the second contact. The additional n-contacts formed within the pixel array serve to spread current more evenly to the LEDs of the LED assembly during operation of the LED assembly. The completed LED assembly may be mounted to a backplane.

While FIG. 11 describes the various contacts of the LED assembly formed in a particular order, it is understood that in other embodiments, the contacts may be formed on the substrate assembly in a different order than that described. In addition, in some embodiments, the LED assembly may comprise n-contacts formed within the pixel array as described above, without the need for n-contacts formed adjacent to and outside the pixel array.

Figure 12:
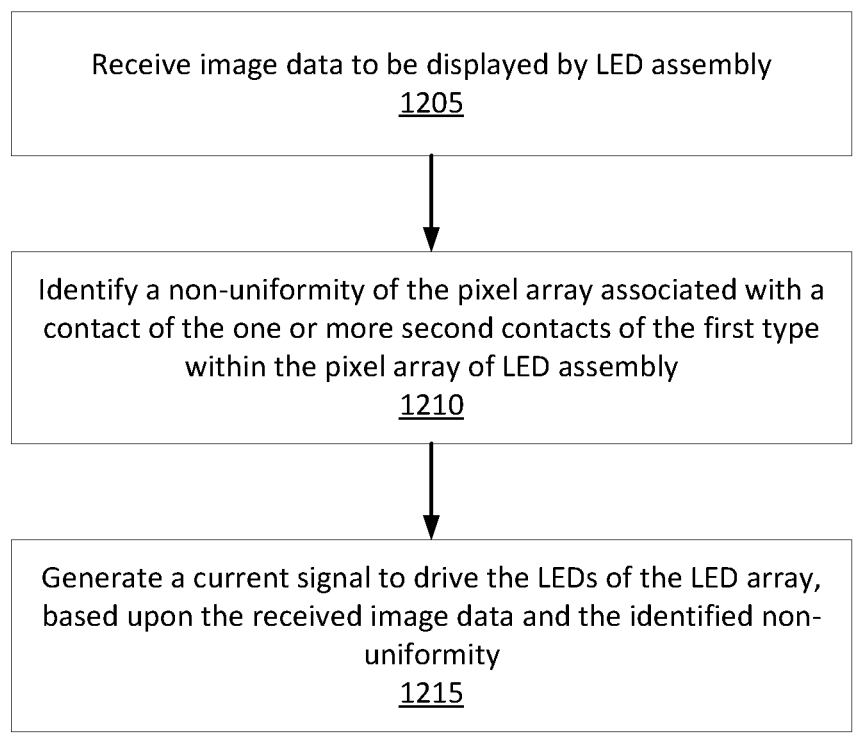
FIG. 12 is a flowchart of a process for displaying images using an LED assembly in accordance with one or more embodiments.

FIG. 12 is a flowchart of a process for displaying images using an LED assembly in accordance with one or more embodiments. The process 1200 may be performed by a controller of the LED assembly.

The controller receives 1205 image data to be displayed using the LED assembly. The controller identifies 1210 a non-uniformity in the pixel array of the LED assembly, the non-uniformity associated with a contact of one or more second contacts of the first type (e.g., n-contacts) within the pixel array of the LED assembly. In some embodiments, the discontinuity corresponds to a missing pixel of the pixel array. In other embodiments, the discontinuity is caused by a non-uniformity in size or location of one or more LEDs within the array (e.g., due to accommodating an n-contact between them). Because the non-uniformity caused by the n-contact within the pixel array is manufactured into the LED assembly, the location and type of the non-uniformity may be known. For example, the controller may store one or more parameters corresponding to the LED assembly indicating a location and/or a type of the non-uniformity.

The controller generates 1215 a current signal to drive the LEDs of the LED array, the generated current signal based upon the received image data and the identified non-uniformity. In some embodiments, the controller generates the current signal to compensate for the identified non-uniformity, such that the image data, when displayed by the LED assembly, will be substantially the same as if displayed using an LED assembly without the non-uniformity. In some embodiments, the controller compensates for the non-uniformity by adjusting a brightness of light from one or more LEDs near the location of the non-uniformity of the pixel array. For example, the controller may scale a value of the image data based upon a location of the LED within the pixel (e.g., relative to the location of the non-uniformity) to determine the current signal to be provided to the LED.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A light emitting diode (LED) assembly comprising:
   an epitaxial LED structure comprising an n-type layer, a layer of light emitting material, and a p-type layer;
   an array of LEDs, wherein each LED of the array of LEDs corresponds to a respective p-contact formed on a first surface of the p-type layer;
   one or more n-contacts formed on the n-type layer outside the array of LEDs;
   one or more additional n-contacts on the n-type layer, each of the one or more additional n-contacts formed between two or more LEDs of the array of LEDs and corresponding to a respective electrode, wherein the one or more additional n-contacts increase a level of current spread in the LED assembly during operation of the LED assembly.

2. The LED assembly of claim 1, wherein the p-type layer and layer of light emitting material are etched or partially etched between the LEDs of the array of LEDs.

3. The LED assembly of claim 1, wherein the p-contacts and the n-contact of the LED assembly are configured to receive current signals to display an image in accordance with a frame of image data, wherein the current signals are adjusted to compensate for a non-uniformity of the array of LEDs caused by a contact of the one or more additional n-contacts within the array of LEDs.

4. The LED assembly of claim 1, wherein the array of LEDs of the LED assembly corresponds to a first color channel, and is positioned to align with an array of LEDs of a second LED assembly corresponding to a second color channel, and wherein the one or more second contacts of the first polarity within the array of LEDs are positioned offset from one or more corresponding second contacts of the first polarity with the array of LEDs of the second LED assembly.

5. The LED assembly of claim 1, wherein a first spacing between two or more LEDs within a first portion of the array of LEDs is larger than a second spacing between two or more LEDs of a second portion of the array of LEDs, and wherein the one or more additional n-contacts are formed in trenches on the n-layer located between two or more LEDs of the array of LEDs having the first, larger spacing.

6. The LED assembly of claim 5, wherein the LEDs of the first portion have a reduced size in comparison to the LEDs corresponding to the second portion.

7. The LED assembly of claim 5, further comprising a dielectric layer disposed within each of the trenches.

8. The LED assembly of claim 7, wherein the one or more additional n-contacts are spaced over regular intervals within the array of LEDs.

9. A method for forming a light emitting diode (LED) assembly, comprising:
    forming an epitaxial LED structure comprising an n-type layer, a layer of light emitting material, and a p-type layer;
    forming on the epitaxial structure an array of LEDs, wherein each LED of the array of LEDs corresponds to a p-contact formed on a first surface of the p-type layer;
    forming one or more n-contacts formed on the n-type layer outside the array of LEDs; and
    forming one or more additional n-contacts on the n-type layer, each of the one or more additional n-contacts formed between two or more LEDs of the array of LEDs and corresponding to a respective electrode, wherein the one or more additional n-contacts increase a level of current spread in the LED assembly during operation of the LED assembly.

10. The method of claim 9, further comprising etching or partially etching the p-type layer and layer of light emitting material between the LEDs of the array of LEDs.

11. The method of claim 9, wherein the one or more additional n-contacts are spaced over regular intervals within the array of LEDs.

12. The method of claim 9, further comprising receiving, at the p-contacts and n-contacts of the LED assembly, current signals to display an image in accordance with a frame of image data, wherein the current signals are adjusted to compensate for a non-uniformity of the array of LEDs caused by a contact of the one or more additional n-contacts within the array of LEDs.

13. The method of claim 9, wherein the array of LEDs of the LED assembly corresponds to a first color channel, and is positioned to align with an array of LEDs of a second LED assembly corresponding to a second color channel, and wherein the one or more second contacts of the first polarity within the array of LEDs are positioned offset from one or more corresponding second contacts of the first polarity with the array of LEDs of the second LED assembly.

14. The method of claim 9, further comprising forming the array of LEDs such that a first spacing between two or more LEDs within a first portion of the array of LEDs is larger than a second spacing between two or more LEDs of a second portion of the array of LEDs, and wherein the one or more additional n-contacts are formed in trenches on the n-layer located between two or more LEDs of the array of LEDs having the first, larger spacing.

15. The method of claim 14, wherein the LEDs of the first portion are formed to have a reduced size in comparison to the LEDs corresponding to the second portion.

16. The method of claim 14, further comprising forming a dielectric layer disposed within each of the trenches.

* * * * *